US012288765B2

(12) United States Patent
Chu et al.

(10) Patent No.: US 12,288,765 B2
(45) Date of Patent: Apr. 29, 2025

(54) HYBRID BONDING STRUCTURES, SEMICONDUCTOR DEVICES HAVING THE SAME, AND METHODS OF MANUFACTURING THE SEMICONDUCTOR DEVICES

(71) Applicant: Samsung Electronics Co., Ltd., Suwon-si (KR)

(72) Inventors: Kunmo Chu, Seoul (KR); Byonggwon Song, Seoul (KR); Junghoon Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 470 days.

(21) Appl. No.: 17/477,806

(22) Filed: Sep. 17, 2021

(65) Prior Publication Data
US 2022/0093549 A1  Mar. 24, 2022

(30) Foreign Application Priority Data
Sep. 23, 2020  (KR) .......................... 10-2020-0123317

(51) Int. Cl.
*H01L 23/00* (2006.01)
(52) U.S. Cl.
CPC .............. *H01L 24/13* (2013.01); *H01L 24/81* (2013.01); *H01L 2224/13083* (2013.01);
(Continued)
(58) Field of Classification Search
CPC ........... H01L 21/60; H01L 2224/13147; H01L 2224/13083; H01L 2924/014; H01L 24/13;
(Continued)

(56) References Cited

U.S. PATENT DOCUMENTS 6,283,359 B1  9/2001  Brofman et al.
8,803,337 B1 *  8/2014  Lin .......................... H01L 29/40
257/781
(Continued)

FOREIGN PATENT DOCUMENTS

CN  106695159 A  5/2017
CN  107009045 A  8/2017
(Continued)

OTHER PUBLICATIONS

Scheuerlein, Christian & Di Michiel, M. & Izquierdo, Gonzalo & Buta, Florin. (2009). Phase Transformations During the Reaction Heat Treatment of Internal Tin Nb Sn Strands With High Sn Content. Applied Superconductivity, IEEE Transactions on. 18. 1754-1760. 10.1109/TASC.2008.2006912. (Year: 2009).*
(Continued)

*Primary Examiner* — Ratisha Mehta
(74) *Attorney, Agent, or Firm* — Harness, Dickey & Pierce, P.L.C.

(57) ABSTRACT

Provided are a hybrid bonding structure, a solder paste composition, a semiconductor device, and a method of manufacturing the semiconductor device. The hybrid bonding structure includes a solder ball and a solder paste bonded to the solder ball. The solder paste includes a transient liquid phase. The transient liquid phase includes a core and a shell on a surface of the core. A melting point of the shell may be lower than a melting point of the core. The core and the shell are configured to form an intermetallic compound in response to the transient liquid phase at least partially being at a temperature that is within a temperature range of about 20° C. to about 190° C.

41 Claims, 17 Drawing Sheets

(52) U.S. Cl.
CPC ............... *H01L 2224/13105* (2013.01); *H01L 2224/13109* (2013.01); *H01L 2224/13113* (2013.01); *H01L 2224/13139* (2013.01); *H01L 2224/13155* (2013.01); *H01L 2224/13193* (2013.01); *H01L 2224/13209* (2013.01); *H01L 2224/13211* (2013.01); *H01L 2224/13213* (2013.01); *H01L 2224/13218* (2013.01); *H01L 2224/13224* (2013.01); *H01L 2224/13239* (2013.01); *H01L 2224/13244* (2013.01); *H01L 2224/13247* (2013.01); *H01L 2224/13255* (2013.01); *H01L 2224/1326* (2013.01); *H01L 2224/81024* (2013.01); *H01L 2224/81825* (2013.01); *H01L 2924/01013* (2013.01); *H01L 2924/01026* (2013.01); *H01L 2924/01028* (2013.01); *H01L 2924/01029* (2013.01); *H01L 2924/0103* (2013.01); *H01L 2924/01047* (2013.01); *H01L 2924/01049* (2013.01); *H01L 2924/0105* (2013.01); *H01L 2924/01079* (2013.01); *H01L 2924/01083* (2013.01); *H01L 2924/014* (2013.01)

(58) Field of Classification Search
CPC ........... H01L 24/81; H01L 2224/13105; H01L 2224/13109; H01L 2224/13113; H01L 2224/13139; B23K 1/0016; B23K 2101/40; B23K 35/0244; B23K 35/025; B23K 35/262
See application file for complete search history.

(56) References Cited

U.S. PATENT DOCUMENTS

| | | | |
|---|---|---|---|
| 8,920,934 B2 | 12/2014 | Jiang et al. | |
| 9,185,812 B2 | 11/2015 | Ueshima | |
| 10,286,498 B2 | 5/2019 | Sharma et al. | |
| 10,675,719 B2* | 6/2020 | Kawasaki | C25D 7/00 |
| 2004/0007384 A1 | 1/2004 | Soga et al. | |
| 2014/0174605 A1 | 6/2014 | Nakagawa et al. | |
| 2014/0291843 A1* | 10/2014 | Jiang | H01L 23/49816 257/738 |
| 2018/0174991 A1 | 6/2018 | Nishino et al. | |
| 2019/0341512 A1* | 11/2019 | Lochtefeld | H01L 31/02327 |
| 2019/0376161 A1* | 12/2019 | Kawasaki | B23K 1/08 |
| 2022/0077100 A1 | 3/2022 | Chu et al. | |

FOREIGN PATENT DOCUMENTS

| | | |
|---|---|---|
| EP | 3216553 B1 | 12/2019 |
| JP | 5754794 B2 | 7/2015 |
| JP | 5811307 B2 | 11/2015 |
| JP | 6106154 B2 | 3/2017 |
| JP | 6607006 B2 | 11/2019 |
| KR | 10-2016-0021648 A | 2/2016 |
| KR | 10-2019-0103760 A | 9/2019 |

OTHER PUBLICATIONS https://www.metallurgy.nist.gov/phase/solder/cusn.html, and references therein (Year: 1996).*
Scheuerlein, Christian and Izquierdo, Gonzalo & Buta, Florin (2009); Phase Transformations during the reaction heat treatment of internal Tin NbSn Strangs with High Sn Content (Year: 2009).*
Zequn Mei et al., "Low-Temperature Solders", Hewlett-Packard Journal, Article 10, Aug. 1996, 10 pgs.
Xiangdong Liu et al., "Low temperature solid-state bonding using Sn-coated Cu particles for high temperature die attach", Journal of Alloys and Compounds, 695, pp. 2165-2172, 2017.
Extended European Search Report dated Feb. 17, 2022 for corresponding European Application No. 21195683.4.

* cited by examiner

HYBRID BONDING STRUCTURES, SEMICONDUCTOR DEVICES HAVING THE SAME, AND METHODS OF MANUFACTURING THE SEMICONDUCTOR DEVICES

CROSS-REFERENCE TO RELATED APPLICATION

This application is based on and claims priority under 35 U.S.C. § 119 to Korean Patent Application No. 10-2020-0123317, filed on Sep. 23, 2020, in the Korean Intellectual Property Office, the disclosure of which is incorporated by reference herein in its entirety.

BACKGROUND

1. Field

The present disclosure relates to hybrid bonding structures configured to bond at a low temperature, semiconductor devices having the same, and methods of manufacturing the semiconductor devices.

2. Description of the Related Art

In semiconductor packaging, methods of bonding to packages to each other by using metal alloys having various melting temperatures have been used. One of these bonding methods is soldering. As a material commonly used for soldering, SnAgCu (SAC)-based solder composed of an alloy of metal materials such as tin (Sn), silver (Ag), and copper (Cu) is a representative example.

In the case of SAC-based solder, the melting point is in the range of about 200° C. to about 230° C., and when the SAC-based solder is used in the case of a highly integrated and thin semiconductor package, a substrate may be bent or stretched depending on a process temperature range. Damage to a solder joint occurs as forces in opposite directions, that is, tensile stress and compressive stress, are applied to upper and lower portions of the substrate.

SUMMARY

Provided are hybrid bonding structures configured to bond at a low temperature.

Provided are semiconductor devices bonded at a low temperature.

Provided are methods of manufacturing a semiconductor device at a low temperature.

Additional aspects will be set forth in part in the description which follows and, in part, will be apparent from the description, or may be learned by practice of the presented embodiments of the disclosure.

According to some example embodiments, a hybrid bonding structure may include a solder ball; and a solder paste bonded to the solder ball. The solder paste may include a transient liquid phase. The transient liquid phase may include a core and a shell on a surface of the core. A melting point of the shell may be lower than a melting point of the core. The core and the shell may be configured to form an intermetallic compound in response to the transient liquid phase at least partially being at a temperature that is within a temperature range of 20° C. to 190° C.

The core may include at least one of tin (Sn), silver (Ag), copper (Cu), indium (In), aluminum (Al), zinc (Zn), bismuth (Bi), nickel (Ni), or iron (Fe).

The shell may include at least one of bismuth (Bi), indium (In), gallium (Ga), or silver (Ag).

The solder ball may include a first tin (Sn)-silver (Ag)-copper (Cu) alloy.

The core may include a second Sn—Ag—Cu alloy, and the shell may include bismuth (Bi).

The core may include copper (Cu), and the shell may include at least one of indium (In) or silver (Ag).

The melting point of the shell may be in a temperature range of about 150° C. to about 200° C.

A re-decomposition temperature of the intermetallic compound may be in a temperature range of about 400° C. to about 650° C.

A ratio of a thickness of the shell to a diameter of the core may be in a range of about 0.02 to about 0.5.

The solder paste may further include a metal particle, and the metal particle may include at least one of tin (Sn), indium (In), silver (Ag), gold (Au), copper (Cu), or nickel (Ni).

The core of the transient liquid phase may have a diameter in a range of about 20 μm to about 45 μm.

A thickness of the shell of the transient liquid phase may be in the range of about 1 μm to about 10 μm.

The transient liquid phase may further include an insertion layer between the core and the shell.

The insertion layer may include at least one of Ni, carbon nanotubes (CNT), graphene, or gallium (Ga).

The solder ball may include at least one alloy of a Sn—Ag—Cu alloy, a Sn—Bi alloy, a Sn—Bi—Ag alloy, or a Sn—Ag—Cu—Ni alloy.

According to some example embodiments, a semiconductor device may include a circuit board; a semiconductor chip; and a hybrid bonding structure between the circuit board and the semiconductor chip, wherein the hybrid bonding structure may include a solder ball and a solder paste bonded to the solder ball. The solder paste may include a transient liquid phase. The transient liquid phase may include a core and a shell on a surface of the core. A melting point of the shell may be lower than a melting point of the core. The core and the shell may be configured to form an intermetallic compound in response to the transient liquid phase at least partially being at a temperature that is within a temperature range of about 20° C. to about 190° C.

The core may include at least one of tin (Sn), silver (Ag), copper (Cu), indium (In), aluminum (Al), zinc (Zn), bismuth (Bi), nickel (Ni), or iron (Fe).

The shell may include at least one of bismuth (Bi), indium (In), gallium (Ga), or silver (Ag).

The solder ball may include a first tin (Sn)-silver (Ag)-copper (Cu) alloy.

The core may include a second Sn—Ag—Cu alloy, and the shell includes bismuth (Bi).

The core may include Cu, and the shell may include at least one of indium (In) or silver (Ag).

The melting point of the shell may be in a temperature range of about 150° C. to about 200° C.

According to some example embodiments, a method of manufacturing a semiconductor device may include forming a semiconductor chip, arranging a solder ball on the semiconductor chip, applying a solder paste to a circuit board, the solder paste including a flux and a transient liquid phase, the transient liquid phase including a core and a shell, positioning the solder ball to face the solder paste, melting the shell at about 20° C. to about 190° C. to form an intermetallic compound between the shell and the core, and bonding the semiconductor chip to the circuit board.

The core may include at least one of tin (Sn), silver (Ag), copper (Cu), indium (In), aluminum (Al), zinc (Zn), bismuth (Bi), nickel (Ni), or iron (Fe).

The shell may include at least one of bismuth (Bi), indium (In), gallium (Ga), or silver (Ag).

The method may further include manufacturing an electronic device that includes the semiconductor device.

According to some example embodiments, an electronic device may include the semiconductor device.

According to some example embodiments, a solder paste composition may include a core and a shell on a surface of the core. A melting point of the shell may be lower than a melting point of the core. The core and the shell may be configured to form an intermetallic compound in response to the solder paste composition at least partially being at a temperature that is within a temperature range of about 20° C. to about 190° C.

The core may include at least one of tin (Sn), silver (Ag), copper (Cu), indium (In), aluminum (Al), zinc (Zn), bismuth (Bi), nickel (Ni), or iron (Fe).

The shell may include at least one of bismuth (Bi), indium (In), gallium (Ga), or silver (Ag).

The core may include a tin (Sn)-silver (Ag)-copper (Cu) alloy, and the shell may include bismuth (Bi).

The core may include copper (Cu), and the shell may include at least one of indium (In) or silver (Ag).

The melting point of the shell may be in a temperature range of about 150° C. to about 200° C.

A re-decomposition temperature of the intermetallic compound may be in a temperature range of about 400° C. to about 650° C.

A ratio of a thickness of the shell to a diameter of the core may be in a range of about 0.02 to about 0.5.

The core may have a diameter in a range of about 20 μm to about 45 μm.

A thickness of the shell may be in a range of about 1 μm to about 10 μm.

The solder paste composition may further include an insertion layer between the core and the shell.

The insertion layer may include at least one of nickel (Ni), carbon nanotubes (CNT), graphene, or gallium (Ga).

The shell may completely cover the surface of the core.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
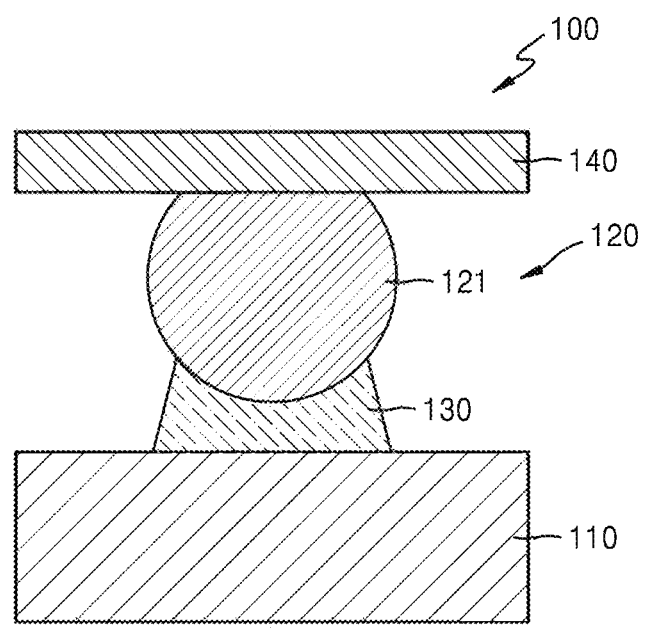
FIG. 1 is a view of a semiconductor device according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, hybrid bonding structures, solder paste compositions, semiconductor devices including the same, and/or electronic devices including the same according to some example embodiments will be described in detail with reference to the accompanying drawings. The same reference numerals refer to the same elements throughout. In the drawings, the sizes of constituent elements may be exaggerated for clarity. It will be understood that, although the terms first, second, etc. may be used herein to describe various elements, these elements should not be limited by these terms. These terms are used only to differentiate an element from another element.

As used herein, the singular forms "a," "an," and "the" are intended to include the plural forms as well, unless the context clearly indicates otherwise. In addition, it will be understood that when a unit is referred to as "comprising" another element, it does not preclude the possibility that one or more other elements may exist or may be added. In addition, thicknesses or sizes of elements in the drawings are exaggerated for convenience and clarity of description. Furthermore, when an element is referred to as being "on" or "above" another element, it may be directly on the other element, or intervening elements (e.g., one or more structures and/or spaces) may also be present such that the element may be indirectly on the element so as to be isolated from direct contact with the other element. Moreover, the materials constituting each layer in the following embodiments are merely examples, and other materials may be used.

In addition, the terms "-er", "-or", and "module" described in the specification mean units for processing at least one function and/or operation and can be implemented by hardware components or software components and combinations thereof.

The particular implementations shown and described herein are illustrative examples of the inventive concepts and are not intended to otherwise limit the scope of the inventive concepts in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a," "an," and "the" and similar referents is to be construed to cover both the singular and the plural.

Operations constituting a method may be performed in any suitable order unless explicitly stated that they should be performed in the order described. Further, the use of any and all examples, or exemplary language (e.g., "such as") provided herein, is intended merely to better illuminate the inventive concepts and does not pose a limitation on the scope of the present disclosure unless otherwise claimed.

FIG. 1 is a view of a semiconductor device according to some example embodiments.

A semiconductor device 100 may include a circuit board 110, a semiconductor chip 140, and a hybrid bonding structure 120 for bonding the circuit board 110 and the semiconductor chip 140. As shown, the hybrid bonding structure 120 is between the circuit board 110 and the semiconductor chip 140. The hybrid bonding structure 120 may be directly between the circuit board 110 and the semiconductor chip 140, such that the hybrid bonding structure 120 is in direct contact with each of the circuit board 110 and the semiconductor chip 140.

The hybrid bonding structure 120 may include a solder ball 121 and a solder paste 130 bonded to the solder ball 121.

The solder ball 121 may include, for example, at least one alloy selected from the group consisting of a Sn—Ag—Cu alloy, a Sn—Bi alloy, a Sn—Bi—Ag alloy, or a Sn—Ag—Cu—Ni alloy. The solder ball 121 may include, for example, at least one alloy of a Sn—Ag—Cu alloy, a Sn—Bi alloy, a Sn—Bi—Ag alloy, or a Sn—Ag—Cu—Ni alloy. The solder ball 121 may include, for example, at least one of Sn—Ag (0.3 to 3)-Cu(0.1 to 1), Sn—Bi(35 to 75), Sn—Bi(35 to 75)-Ag(0.1 to 20), and Sn—Ag(0.5 to 5)-Cu(0.1 to 2)-Ni (0.05 to 0.1). The solder ball 121 may include a Sn—Ag—Cu alloy (e.g., SAC alloy). For example, when the solder ball 121 is composed of a Sn—Ag—Cu alloy, the solder ball 121 may include SAC305 (e.g., Sn-3.0Ag-0.5Cu) or SAC205 (e.g., Sn-2.0Ag-0.5Cu).

The solder paste 130 may include a transient liquid phase and a flux. In some example embodiments, the flux may be omitted. In some example embodiments, some or all of the solder paste 130, including the transient liquid phase and including or excluding the flux, may be referred to herein as a solder paste composition. For example, the transient liquid phase may, in some example embodiments, be interchangeably referred to as a solder paste composition. It will be understood that all descriptions of the transient liquid phase according to any of the example embodiments may apply to a solder paste composition that includes at least the transient liquid phase and may comprise, with or without the flux, the solder paste 130.

Figure 2A:
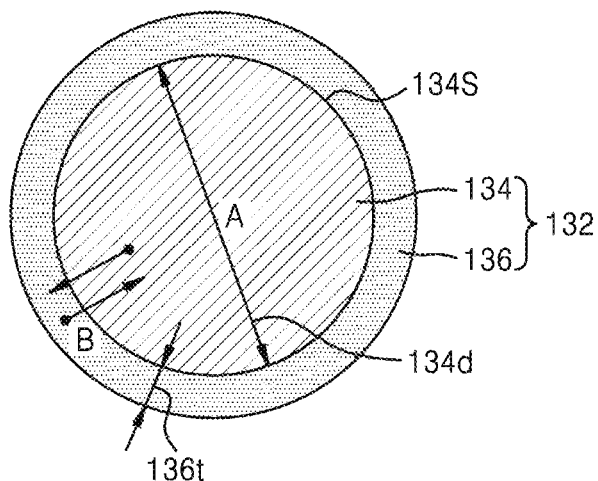
FIGS. 2A and 2B are enlarged views of a transient liquid phase of a semiconductor device according to some example embodiments.
Figure 2B:
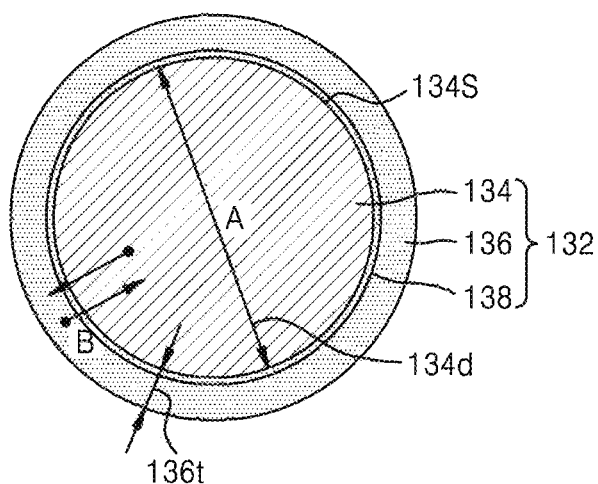

FIGS. 2A and 2B schematically show a transient liquid phase that may be included in the solder paste 130 shown in at least FIG. 1. The transient liquid phase 132 may include a core 134 and a shell 136 provided on (e.g., directly or indirectly on) the surface 134S of the core 134. In some example embodiments, the shell 136 may completely cover the surface 134S (e.g., outer surface) of the core 134. Where the shell 136 completely covers the surface 134S, the shell 136 may isolate the core 134 from exposure to an exterior of the transient liquid phase 132. In some example embodiments, the shell 136 may partially (e.g., imperfectly) cover the surface 134S of the core 134, such that at least a portion of the surface 134S of the core 134 is directly exposed to an exterior of the transient liquid phase 132.

A melting point of the shell 136 may be less than (e.g., lower than) a melting point of the core 134. Restated, a temperature of the melting point of the shell 136 may be lower than a temperature of the melting point of the core 134. For example, the shell 136 may have a melting point in the range (e.g. temperature range) of about 120° C. to about 200° C. For example, the shell 136 may have a melting point in the range of about 150° C. to about 200° C. For example, the shell 136 may have a melting point in the range of about 150° C. to about 190° C. For example, the core 134 may have a melting point of about 200° C. or higher (e.g., about 200° C. to about 500° C.).

The core 134 may include at least one of tin (Sn), silver (Ag), copper (Cu), indium (In), aluminum (Al), zinc (Zn), bismuth (Bi), nickel (Ni), or iron (Fe). The core 134 may have a composition similar to that of the solder ball 121. For example, the core 134 may include at least one alloy selected from the group consisting of a Sn—Ag—Cu alloy, a Sn—Bi alloy, a Sn—Bi—Ag alloy, or a Sn—Ag—Cu—Ni alloy. For example, the core 134 may include at least one alloy of a Sn—Ag—Cu alloy, a Sn—Bi alloy, a Sn—Bi—Ag alloy, or a Sn—Ag—Cu—Ni alloy. In some example embodiments, the core 134 may include a Sn—Ag—Cu alloy, which may be the same as or different from a Sn—Ag—Cu alloy included in the solder ball 121. The shell 136 may include at least one of bismuth (Bi), indium (In), gallium (Ga), or silver (Ag). In some example embodiments, the core 134 may include Cu, and the shell 136 may include at least one of In or Ag. In the transient liquid phase 132, some materials B of the core 134 and some materials A of the shell 136 are mixed in a liquid state according to (e.g., in response to) temperature to form (e.g., establish, generate, create, etc.) an intermetallic compound. The core 134 and the shell 136 may form an intermetallic compound during a reflow process. The core 134 and the shell 136 may form (e.g., may collectively form, may at least partially mix to form, etc.) an intermetallic compound in a temperature range of, for example, about 20° C. to about 190° C. For example, the core 134 and the shell 136 may at least partially mix to form the intermetallic compound in response to the transient liquid phase at least partially being at a temperature within the temperature range of about 20° C. to about 190° C. The intermetallic compound is a compound composed of two or more metals. A typical alloy has a structure of a solid solution in which a structure of one of original metals is maintained, and the other of the original metals is randomly substituted. The typical alloy is called a solid solution alloy. The composition of the solid solution alloy may be made in various ratios within a certain range even if the constituent metals are the same. In some example embodiments, the intermetallic compound is a compound having a crystal structure different from that of the original metals. The composition of the intermetallic compound may at least partially comprise two or more metals with a simple integer ratio. For example, as shown in FIGS. 3A-3B, where the core 134 includes material A and the shell 136 includes material B, the composition of the intermetallic compound may include $AB_2$ (e.g., a 2:1 ratio of B:A).

In some example embodiments, as shown in at least FIG. 2B, an insertion layer 138 may be further provided between (e.g., directly between) the core 134 and the shell 136 in the transient liquid phase 132. The insertion layer 138 may include, for example, at least one of Ni, carbon nanotubes (CNT), graphene, or Ga.

Figure 3A:
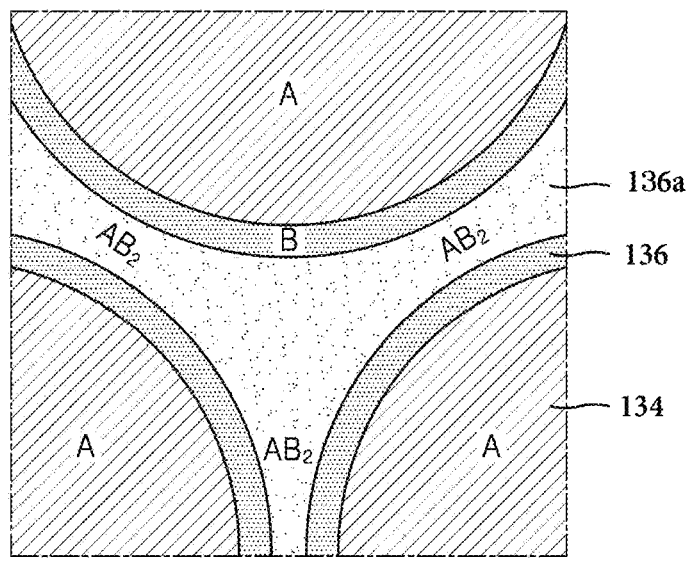
FIGS. 3A and 3B are views illustrating a locally melted state of a transient liquid phase of a semiconductor device, according to some example embodiments.
Figure 3B:
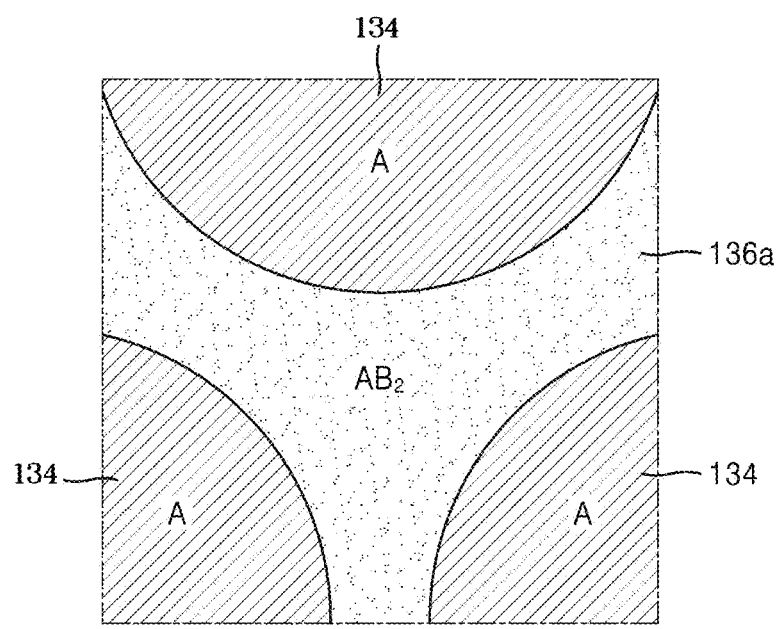

FIGS. 3A and 3B show a state in which a solder paste is at least partially melted. The shell 136 of the transient liquid phase 132 may be at least partially melted to form an intermetallic compound 136a by the core 134 and the shell 136. In FIG. 3A the shell 136 is partially melted and mixed with at least some material of the core 134 to form the intermetallic compound 136a, and in FIG. 3B the shell 136 is completely melted and mixed with at least some material of the core 134 to form the intermetallic compound 136a. The shell 136 may be at least partially melted to form the intermetallic compound 136a, and the solder ball 121 and the solder paste 130 may be bonded to each other by the intermetallic compound 136a. The shell 136 has a lower melting point than the core 134, and the core 134 is configured to include a composition having physical properties similar to those of the solder ball 121, so that bonding force between the solder ball 121 and the solder paste 130 may be increased, and destruction due to external impact may be reduced. The shell 136 may lower a melting temperature, and the core 134 may improve mechanical properties at a bonding boundary area between the solder ball 121 and the solder paste 130. That is, the core 134 may include a material having a composition similar to that of the solder ball 121 to reduce a difference in physical properties between the solder ball 121 and the solder paste 130, thereby improving mechanical properties at the bonding boundary area. The bonding boundary area may include, for example, a central area of a bonding area between the solder ball 121 and the solder paste 130.

The transient liquid phase 132 may be configured such that the core 134 and the shell 136 form an intermetallic compound in a temperature range of, for example, about 20° C. to about 190° C. (e.g., in response to the transient liquid phase 132 being at least partially at a temperature within the temperature range of, for example, about 20° C. to about 190° C.). FIGS. 3A and 3B show that the core 134 and the shell 136 form the intermetallic compound 136a. A re-decomposition temperature of the intermetallic compound 136a may be about 400° C. or higher. For example, the re-decomposition temperature of the intermetallic compound 136a may be in a temperature range of about 400° C. to about 650° C.

For example, the solder ball 121 may include a SnAgCu alloy (e.g., a first SnAgCu alloy), the core 134 may include a SnAgCu alloy (e.g., a second SnAgCu alloy which may be the same as or different from the first SnAgCu alloy), and the shell 136 may include Bi.

Figure 4:
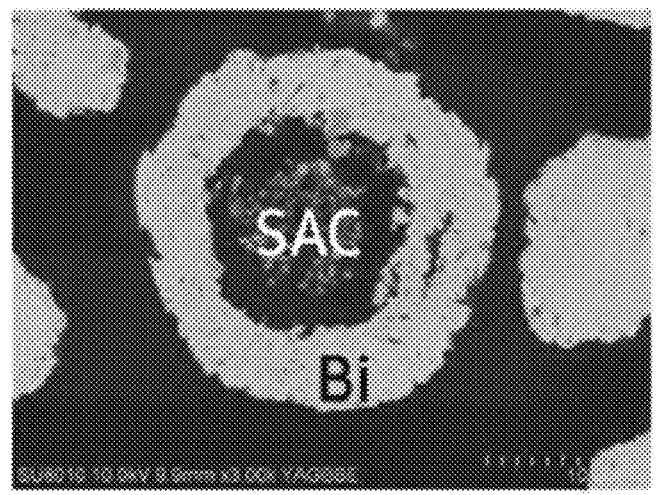
FIG. 4 is a view illustrating an example of a transient liquid phase of a hybrid bonding structure, according to some example embodiments.

FIG. 4 is a view illustrating an example of a transient liquid phase of a hybrid bonding structure, according to some example embodiments. FIG. 4 shows a transient liquid phase in which the core 134 includes SnAgCu alloy and the shell 136 includes Bi. In some example embodiments, the solder ball 121 may include a SnAgCu alloy, the core 134 may include Cu, and the shell 136 may include at least one of In or Ag.

Figure 5:
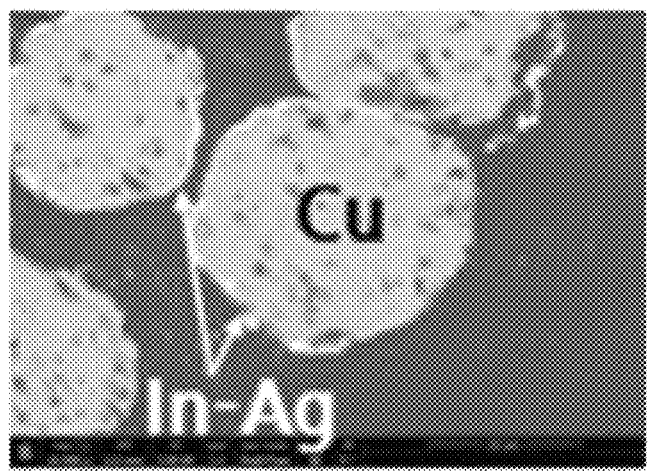
FIG. 5 is a view illustrating another example of a transient liquid phase of a hybrid bonding structure, according to some example embodiments.

FIG. 5 is a view illustrating another example of a transient liquid phase of a hybrid bonding structure, according to some example embodiments. FIG. 5 shows a transient liquid phase in which the core 134 includes Cu and the shell 136 includes In—Ag.

Figure 6:
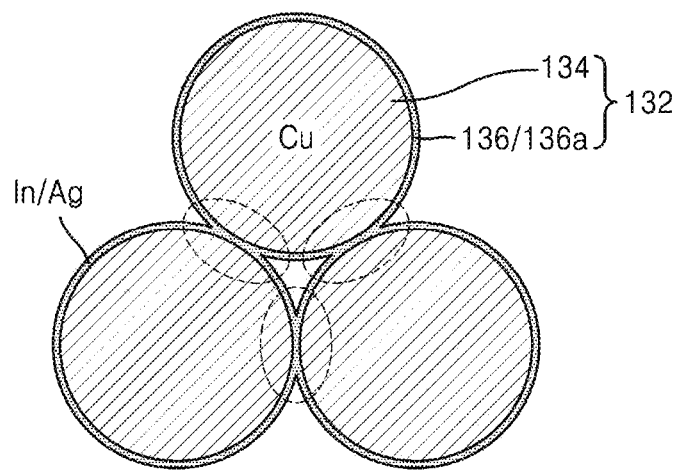
FIG. 6 is a view illustrating a locally melted state of a Cu/In/Ag transient liquid phase of a semiconductor device, according to some example embodiments.

FIG. 6 shows the bonding between transient liquid phases 132. For example, the core 134 may include Cu, and the shell 136 may include In/Ag. When heat is applied to the transient liquid phases 132, the shell 136 melts, and an intermetallic compound 136a may be formed between the core 134 and the shell 136 and/or between the shell 136 and an exterior of the transient liquid phase 132. The transient liquid phases 132 may be locally bonded to each other by the intermetallic compound 136a. In addition, bonding strength between the transient liquid phases 132 and a solder paste including a flux may be increased.

In some example embodiments, the solder paste 130 may further include a metal particle. The metal particle may include, for example, at least one of Au, Ag, Sn, In, Cu, or Ni.

When the transient liquid phase 132 is melted by a reflow process, a flux is volatilized and removed, and only metal particles may remain. The flux may include volatile components. The flux may remove an oxide film or improve a solder phase flow. The solder paste 130 is composed of a mixture of the transient liquid phase 132 and the flux. Referring to FIGS. 2A and 2B, the core 134 of the transient liquid phase 132 may have a diameter 134d in a range of, for example, about 20 μm to about 45 μm.

The flux may include organic materials. The flux may include a water-soluble flux or a fat-soluble flux. The flux may include at least one selected from the group consisting of a rosin-based flux, a resin-based flux, and an organic acid-based flux. However, the flux is not limited thereto. The flux may facilitate the fluidity of the transient liquid phase 132 and a reaction between particles, and may facilitate a printing process.

A hybrid solder structure according to some example embodiments may be soldered by local melting of a shell during reflow. FIG. 6 conceptually shows local bonding by an InAg shell.

A hybrid solder structure according to some example embodiments may be used as a low-temperature bonding material applied to, for example, a data server, a laptop computer, a mobile phone, a home appliance such as a TV, a computer, and a mobile product, all of which may be examples of an electronic device 2500 according to any of the example embodiments. As a substrate becomes thinner and a semiconductor device becomes smaller, the semiconductor device may be affected by temperature. Accordingly, a structure capable of being bonded at a low temperature may be employed as a bonding structure for bonding a semiconductor device to have as little influence on the semiconductor device as possible. However, for example, Sn58Bi is a low-temperature bonding material, but a Bi component is brittle and may be easily damaged by drop impact and thermal deformation.

A hybrid bonding structure according to some example embodiments may be bonded at a low temperature and may have strong properties against brittleness. The solder paste 130 includes the transient liquid phase 132 to alleviate brittleness, and the content of the transient liquid phase 132, the thickness of a shell, and the content of a shell may be adjusted. For example, referring to FIGS. 2A and 2B, a core 134 may have a diameter 134d ranging from about 20 μm to about 45 μm, and a shell 136 may have a thickness 136t ranging from about 1 μm to about 10 μm. Referring to FIGS. 2A and 2B, for example, a ratio (shell thickness/core diameter) of the shell 136 thickness 136t to the core 134 diameter 134d may be in a range of about 0.02 to about 0.5. Where the core 134 diameter 134d is outside the above-noted range, where the shell 136 thickness 136t is outside the above-noted range, and/or where the ratio (shell thickness/core diameter) of the shell 136 thickness 136t to the core 134 diameter 134d is outside the above-noted range, the adhesion of the shell 136 to the core 134 may decrease, intermetallic compound 136a formation may be at least partially inhibited, and/or damage to the transient liquid phase 132 may occur.

Figure 7:
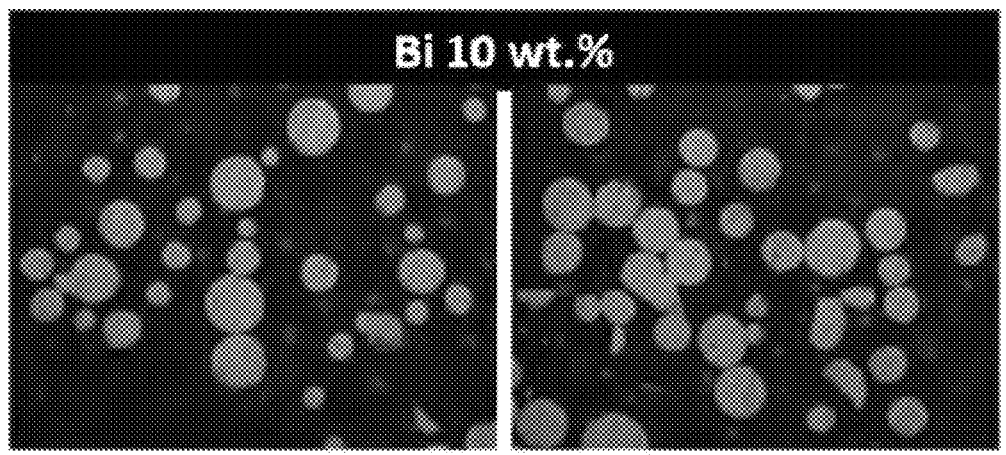
FIGS. 7 and 8 are enlarged photographs of a solder paste according to a bismuth (Bi) content of a solder paste, according to some example embodiments.
Figure 8:
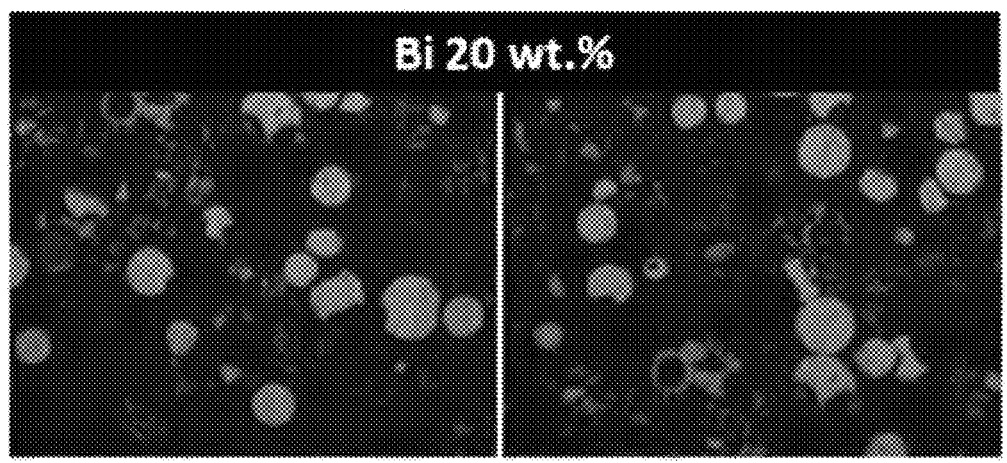

FIGS. 7 and 8 are enlarged photographs of a solder paste according to a bismuth (Bi) content of a solder paste, according to some example embodiments. FIGS. 7 and 8 show images for each Bi content of a transient liquid phase including a SAC core and a Bi shell. FIG. 7 shows a case of Bi 10 wt %, and FIG. 8 shows a case of Bi 20 wt %. When the Bi content increases, a shell surface tends to change to a dark color. For example, when the Bi content increases from about 10% to about 20%, the surface of the transient liquid phase may become rough. When the surface of the transient liquid phase becomes rough, uniformity of a plating thickness of a shell decreases, and bonding strength with a core may decrease. For example, the Bi content may range from about 10% to about 20%.

Figure 9:
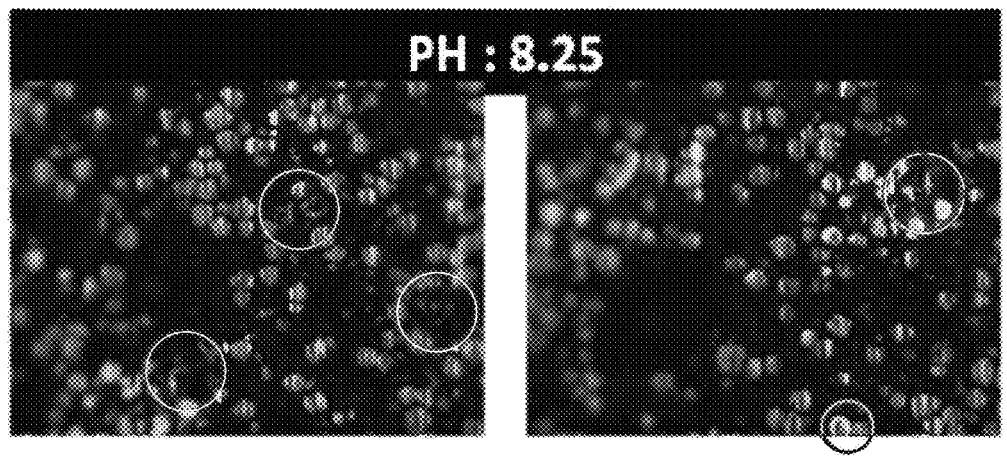
FIGS. 9, 10, 11, and 12 are photographs according to PH during plating of a transient liquid phase included in a solder paste, according to some example embodiments.
Figure 10:
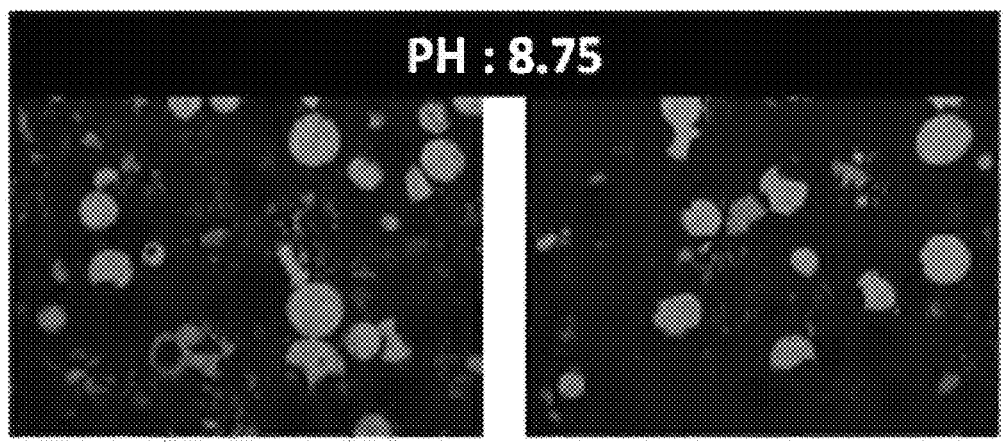
Figure 11:
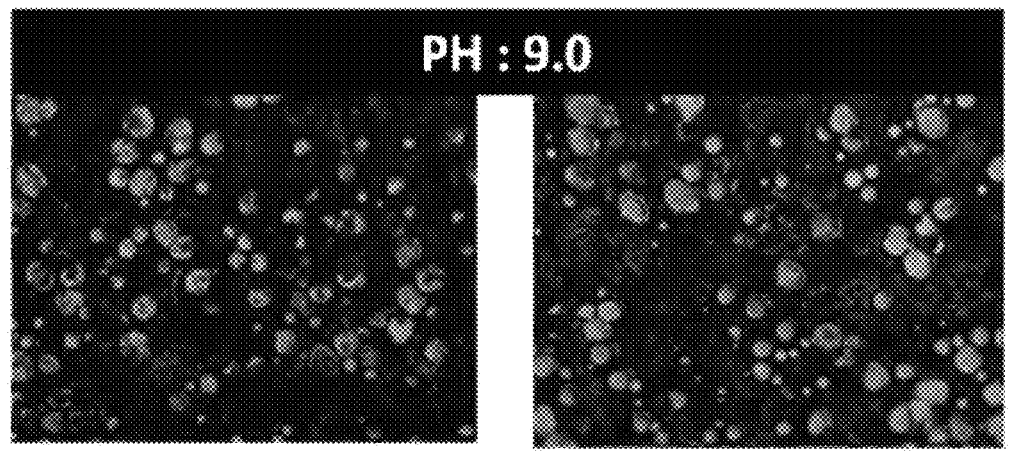
Figure 12:
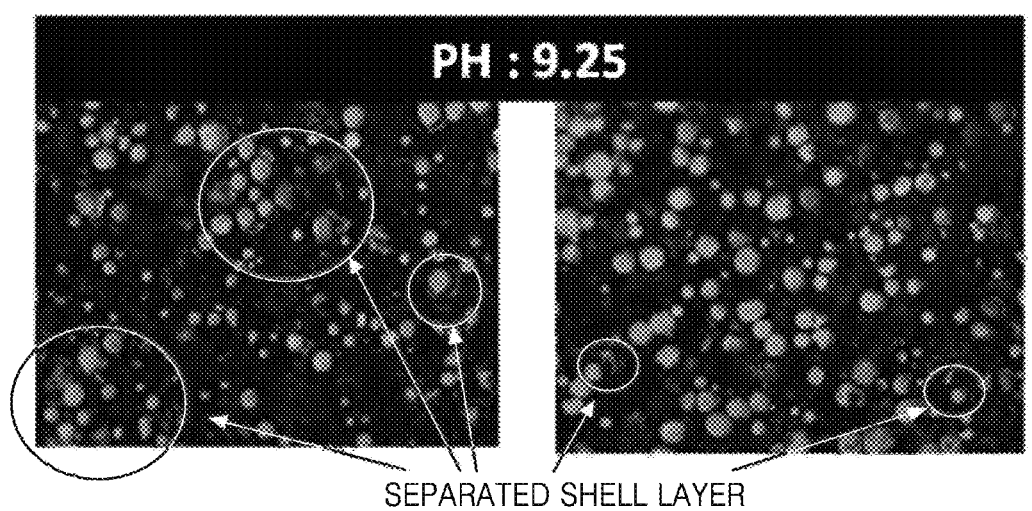

FIGS. 9, 10, 11, and 12 are photographs according to PH during plating of a transient liquid phase included in a solder paste, according to some example embodiments. The transient liquid phase may be produced by plating. When plating the shell on the core, the shell may be coated on the core while adjusting the pH of a plating solution. FIG. 9 shows a cross-sectional image of a transient liquid phase when the PH is 8.25, FIG. 10 shows a cross-sectional image of a transient liquid phase when the PH is 8.75, FIG. 11 shows a cross-sectional image of a transient liquid phase when the PH is 9.0, and FIG. 12 shows a cross-sectional image of a transient liquid phase when the PH is 9.25. For example, when the PH is greater than 9.25, the Bi shell tends to separate. For example, when plating the shell of the transient liquid phase, the cell may be plated with a plating solution having a pH in the range of about 9.0 to about 9.25.

Figure 13:
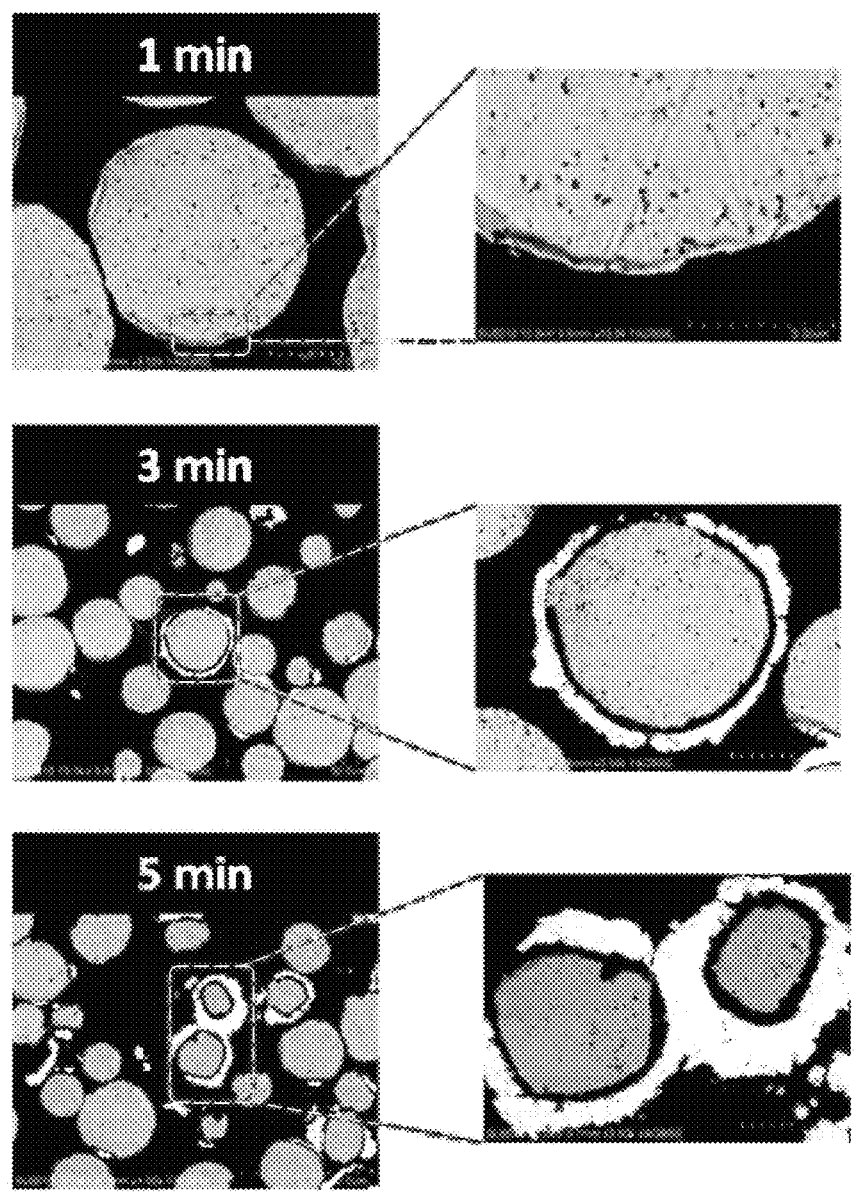
FIG. 13 is a photograph of a transient liquid phase included in a solder paste according to a plating time, according to some example embodiments.

FIG. 13 shows a cross-sectional image of a transient liquid phase for each plating time of a shell.

When the transient liquid phase is produced by a plating method, the thickness of the shell increases as the plating time increases. For example, the thickness of the shell may be about 0.35 μm when plating 1 minute, the thickness of the shell may be about 2.5 μm when plating 3 minutes, and the thickness of the shell may be about 5 μm to about 8 μm when plating 5 minutes. As the thickness of the shell increases, the adhesion to a core may decrease. For example, when the plating time is increased up to 35 minutes, damage to the transient liquid phase is observed. Plating process factors largely include temperature, time, PH, and rotation speed (rpm). The transient liquid phase may be plated by appropriately controlling the plating time, the temperature, and the PH.

Figure 14:
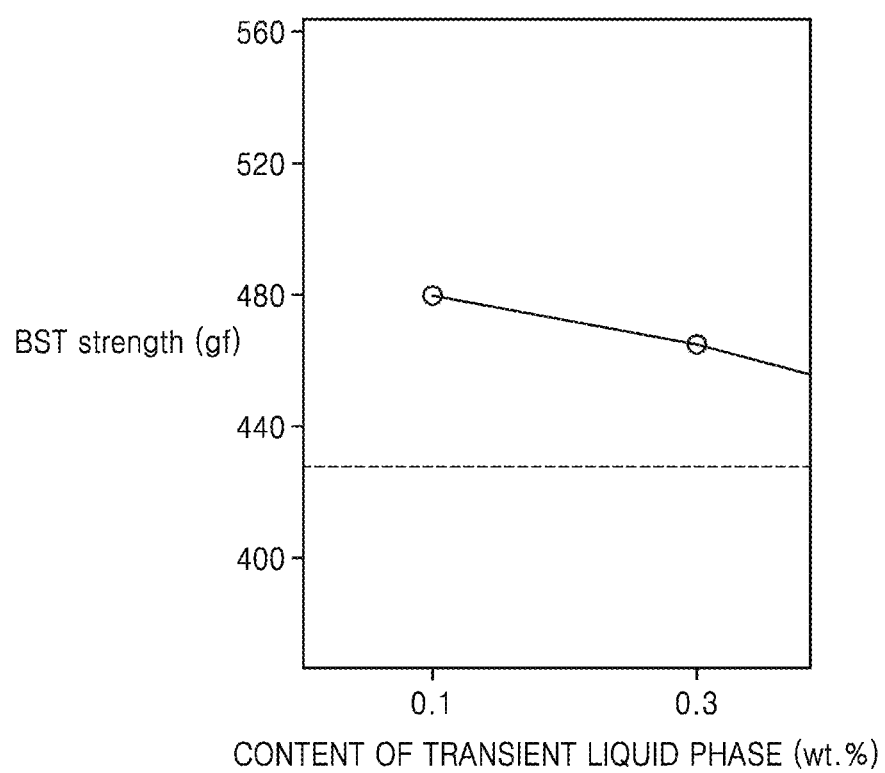
FIG. 14 is a view illustrating BST strength according to the content of a transient liquid phase of a hybrid bonding structure, according to some example embodiments.

FIG. 14 shows ball shear test (BST) strength according to the amount of transient liquid phase as a proportion in wt % of the total solder paste. The BST strength may represent shear stress strength. When the content of the transient liquid phase to the total solder paste is 0.1 wt % and 0.3 wt %, for example, each exhibits BST strength greater than about 400 gf. While a Sn58Bi solder exhibits BST strength of about 380 gf under the same experimental conditions, in some example embodiments, it may have BST strength of 400 gf or more. For example, the transient liquid phase may have a content of 0.5 wt % or less. Thereby, the BST strength may be increased. However, the content of the transient liquid phases is not limited thereto.

Referring to FIG. 14, the transient liquid phase may have a content of greater than about 0 wt % and less than about 0.5 wt %. For example, the transient liquid phase includes a SAC core and a Bi shell, and may have a content of about 0.05 wt % to about 0.5 wt %. When the content of the transient liquid phase is 0.1 wt %, the shear stress strength increases, and when the content of the transient liquid phase is 0.3 wt %, the shear stress strength decreases. In FIG. 14, the dashed line shows a comparative example in which a solder paste includes Sn57Bi1Ag, and in the case of a solder paste including a transient liquid phase having a content of greater than about 0 wt % and less than about 0.5 wt %, the shear stress strength is higher than that of the comparative example.

Figure 15:
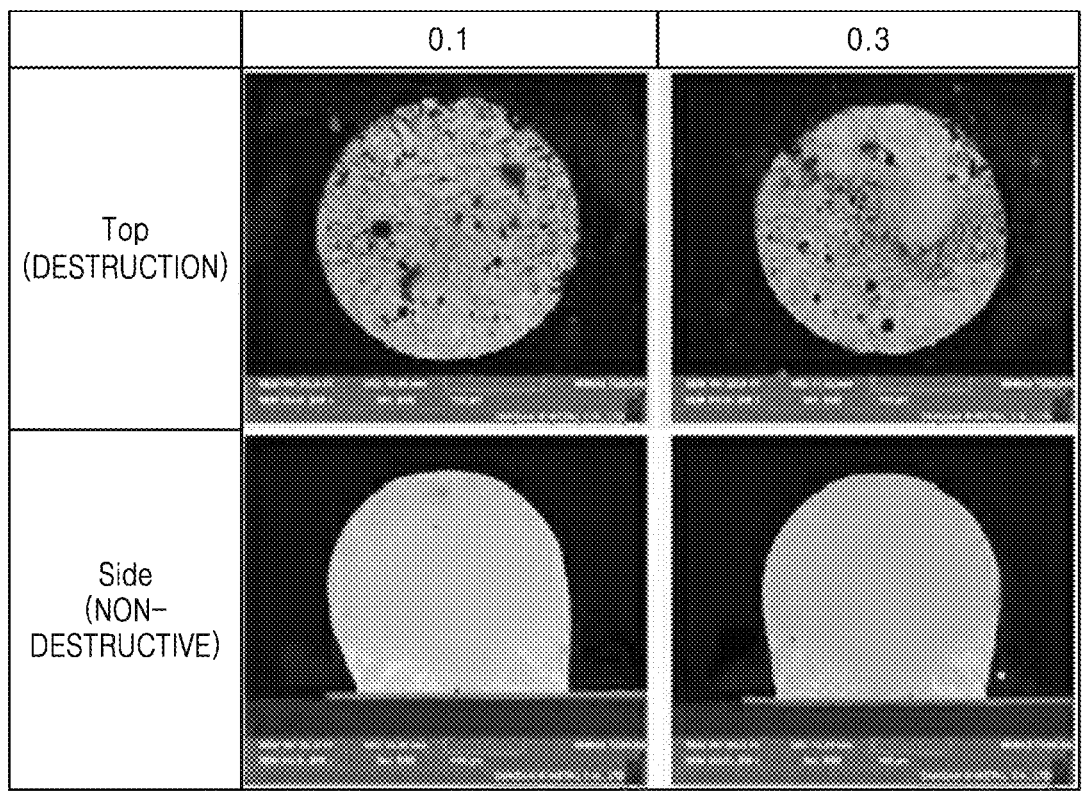
FIG. 15 is a view illustrating a solder cross section and a solder joint according to the content of a transient liquid phase of a hybrid bonding structure, according to some example embodiments.

FIG. 15 shows images of a cross section of a solder paste and a fracture surface of solder paste bonding when the content of a transient liquid phase is about 0.1 wt % and about 0.3 wt %. A fracture location is observed through the analysis of solder fracture section. Solder fracture generally occurs near the boundary between a solder ball and a low temperature solder paste. When the transient liquid phase has a content of 0.3 wt %, ductile fracture occurs in a solder ball area.

Figure 16:
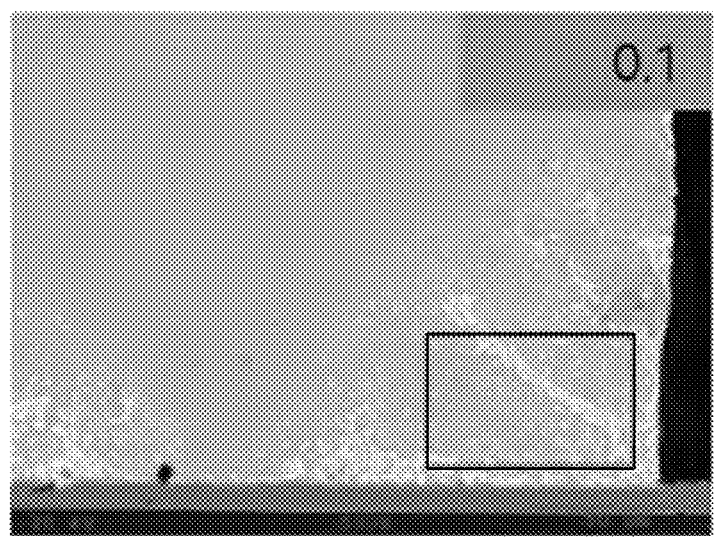
FIG. 16 is a view of a microstructure of a bonding cross section of a hybrid bonding structure, according to some example embodiments.
Figure 17:
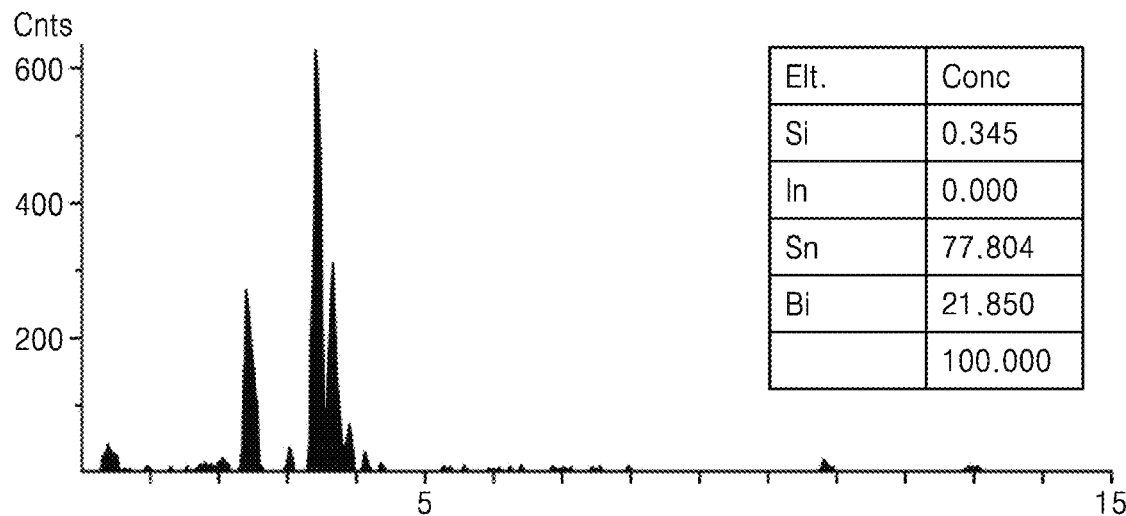
FIG. 17 is a view illustrating results of component analysis of a joint of a hybrid bonding structure, according to some example embodiments.

FIG. 16 shows a microstructure of a bonding cross-section of a solder paste including a transient liquid phase formed of SAC/Bi, and FIG. 17 shows a result of analyzing components of the transient liquid phase.

Figure 18:
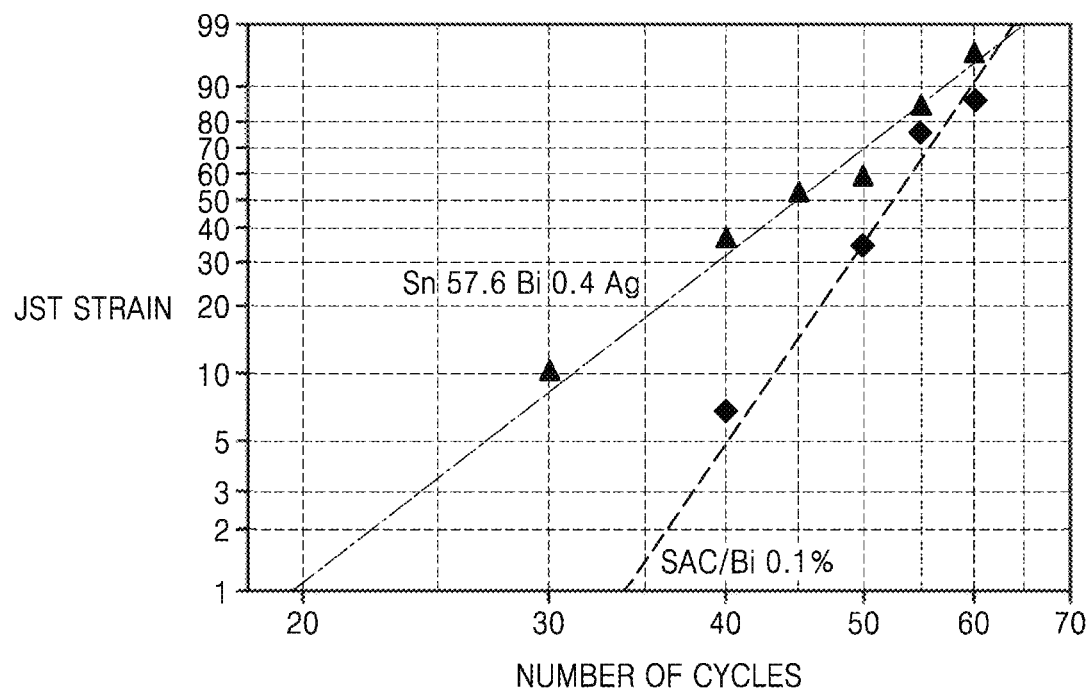
FIG. 18 is a graph illustrating JST strain according to the number of cycles of a hybrid bonding structure, according to some example embodiments.

FIG. 18 shows a result of evaluating the deformation of a joint of a hybrid bonding structure. FIG. 18 shows joint shift test (JST) strain according to the number (e.g., quantity) of thermal cycles (T/C). A glass chip for evaluation is prepared and the deformation of a joint during T/C evaluation is observed.

A comparative example shows a case where a solder paste includes Sn57.6Bi0.4Ag. In addition, a solder paste according to some example embodiments includes a transient liquid phase having a SAC/Bi core shell structure, and some example embodiments show a result of evaluating the deformation of a joint when about 0.1 wt % of the transient liquid phase is included. Compared to the comparative example, in the case of including the transient liquid phase according to some example embodiments, the strain is relatively small.

The following shows the number (e.g., quantity) of joints with deformation according to the number (e.g., quantity) of thermal cycles.

TABLE 1

| the number of cycles | number of joints with deformation - comparative example (Sn57.6Bi0.4Ag) | number of joints with deformation - SAC/Bi 0.1 wt % |
| --- | --- | --- |
| 10. | 0 | 0 |
| 20 | 0 | 0 |
| 30 | 5 | 0 |
| 40 | 13 | 2 |
| 45 | 8 | 0 |
| 50 | 3 | 8 |
| 55 | 13 | 12 |
| 60 | 6 | 3 |
| 65 | 2 | 4 |

A hybrid bonding structure according to some example embodiments may be bonded at a low temperature and may reduce a defect rate of a joint caused by thermal deformation. In addition, compared to a Sn58Bi-based solder paste of the comparative example, mechanical properties, for example, toughness may be improved. When the Sn58Bi-based solder paste is applied to the hybrid bonding structure, a joint failure occurs in less than about 100 cycles when evaluating thermal shock. The joint failure includes, for example, a ball shift, a crack, and the like, and the joint failure may lead to a final overall package failure. Therefore, it is necessary to secure toughness equal to or greater than that of the existing SAC305 solder while lowering a melting point of a solder.

When a solder paste of the hybrid bonding structure according to some example embodiments includes a transient liquid phase having a core-shell structure, a defect rate due to poor application and wettability of the solder paste may be reduced.

FIGS. 19, 20, 21, 22, and 23 are views illustrating a method of manufacturing a semiconductor device, according to some example embodiments. FIG. 24 is a flowchart illustrating a method of manufacturing a semiconductor device, according to some example embodiments.

Referring to FIG. 24, at S2410 a semiconductor chip 310 may be formed. The semiconductor chip 310 may be formed via various operations, including, without limitation, deposition of materials on a substrate or other devices, for example via physical vapor deposition (PVD), chemical vapor deposition (CVD), electrochemical deposition (ECD), molecular beam epitaxy (MBE), atomic layer deposition (ALD), or the like. The semiconductor chip 310 may be formed via various operations, including etching, patterning, or the like of one or more layers of deposited material. The semiconductor chip 310 may be formed via various operations, including front-end-of-line (FEOL) processing, back-end-of-line (BEOL) processing.

Figure 19:
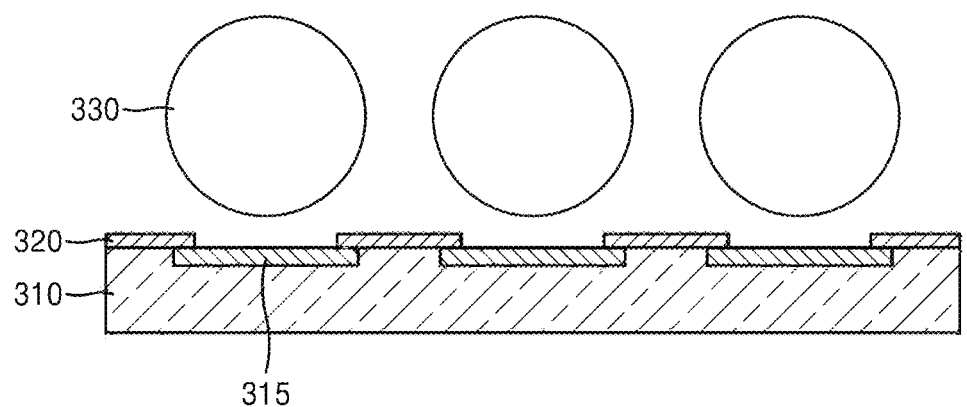
FIGS. 19, 20, 21, 22, and 23 are views illustrating a method of manufacturing a semiconductor device, according to some example embodiments.

Referring to FIG. 19 and FIG. 24, at S2420 a metal pad 315 may be formed on a semiconductor chip 310. In some example embodiments, the formation of the metal pad 315 on the semiconductor chip at S2420 may be considered to be part of the formation of the semiconductor chip 310 at S2410. Still referring to FIG. 19 and FIG. 24, at S2430 solder balls 330 may be arranged on (e.g., indirectly on or directly on) the metal pad 315. The solder balls 330 may be arranged on the metal pad 315 such that the solder balls 330 are spaced apart from each other as shown in FIG. 19. The semiconductor chip 310 may include, for example, a memory chip or an LED chip. The semiconductor chip 310 may include, for example, dynamic random access memory (DRAM) or phase-change RAM (PRAM). Reference numeral 320 denotes a protective film.

Figure 20:
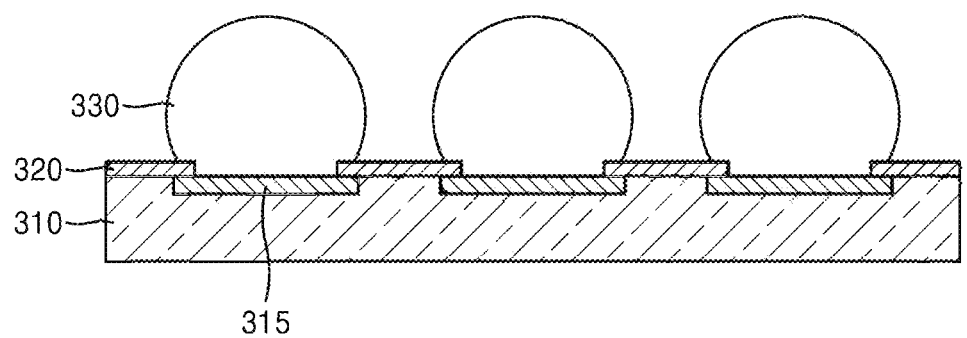

Referring to FIG. 20 and FIG. 24, at S2440 a solder ball 330 may be attached to the metal pad 315. The solder ball 330 may include, for example, at least one alloy selected from the group consisting of a Sn—Ag—Cu alloy, a Sn—Bi alloy, a Sn—Bi—Ag alloy, or a Sn—Ag—Cu—Ni alloy. In some example embodiments, the attaching of the solder ball 330 to the metal pad 315 at S2440 may be considered to be part of the arranging of the solder balls 330 on the semiconductor chip 310 at S2430.

Figure 21:
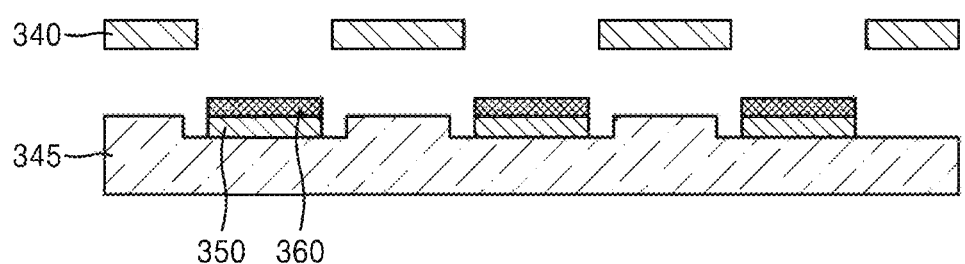

Referring to FIG. 21 and FIG. 24, at S2450 a solder paste 360 may be applied to a circuit board 345, for example by using a mask 340. As a method of applying the solder paste 360, for example, a stencil printing method may be used. The circuit board 345 may include an electrode 350 along with a wire or a thin-film transistor (TFT) required to supply power. The electrode 350 may be a part of a metal wire formed on the circuit board 345 or a metal pad connected to the wire. Because the solder paste 360 is substantially the same as that described with reference to FIGS. 1 to 18 (e.g., the solder paste 360 may include a flux and a transient liquid phase, the transient liquid phase including a core and a shell as described herein with regard to any of the example embodiments), a detailed description thereof will not be given herein.

Figure 22:
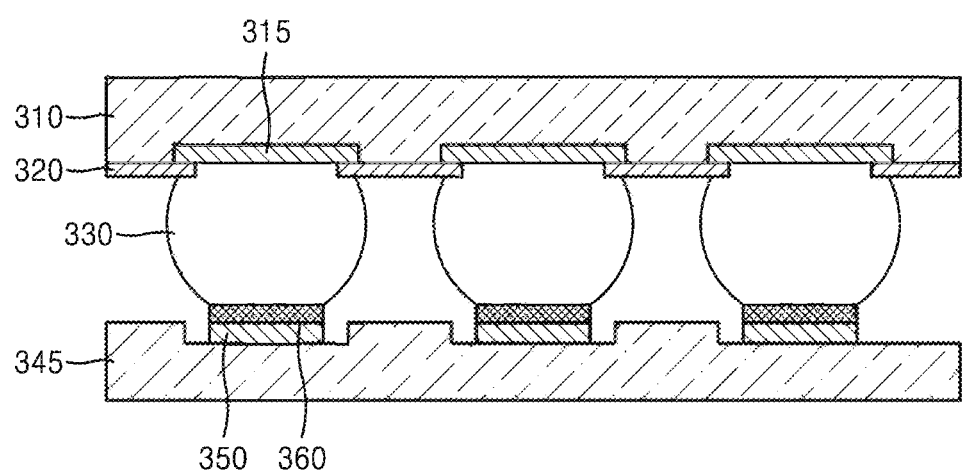

Referring to FIG. 22 and FIG. 24, at S2460 the solder ball 330 of FIG. 20 may be positioned to face the solder paste 360 and at S2470 may be brought into contact with the solder paste 360. In some example embodiments, the bringing the solder ball 330 into contact with the solder paste 360 at S2470 may be considered to be part of the positioning of the solder ball 330 to face the solder paste 360 at S2460.

Figure 23:
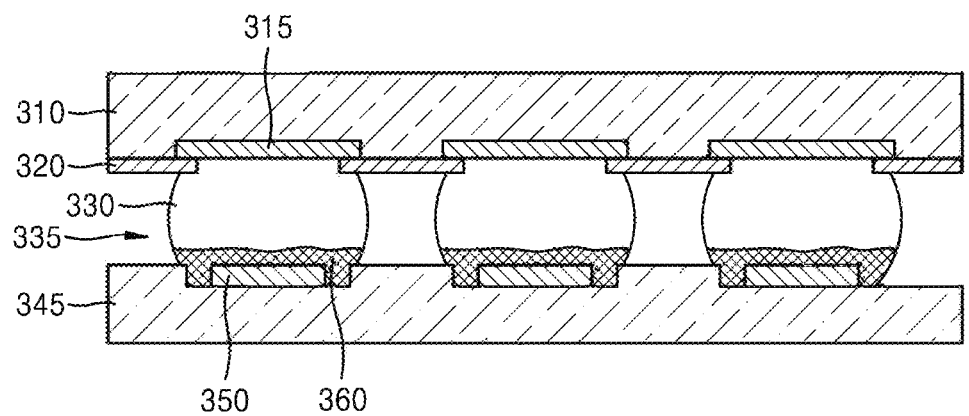
Figure 24:
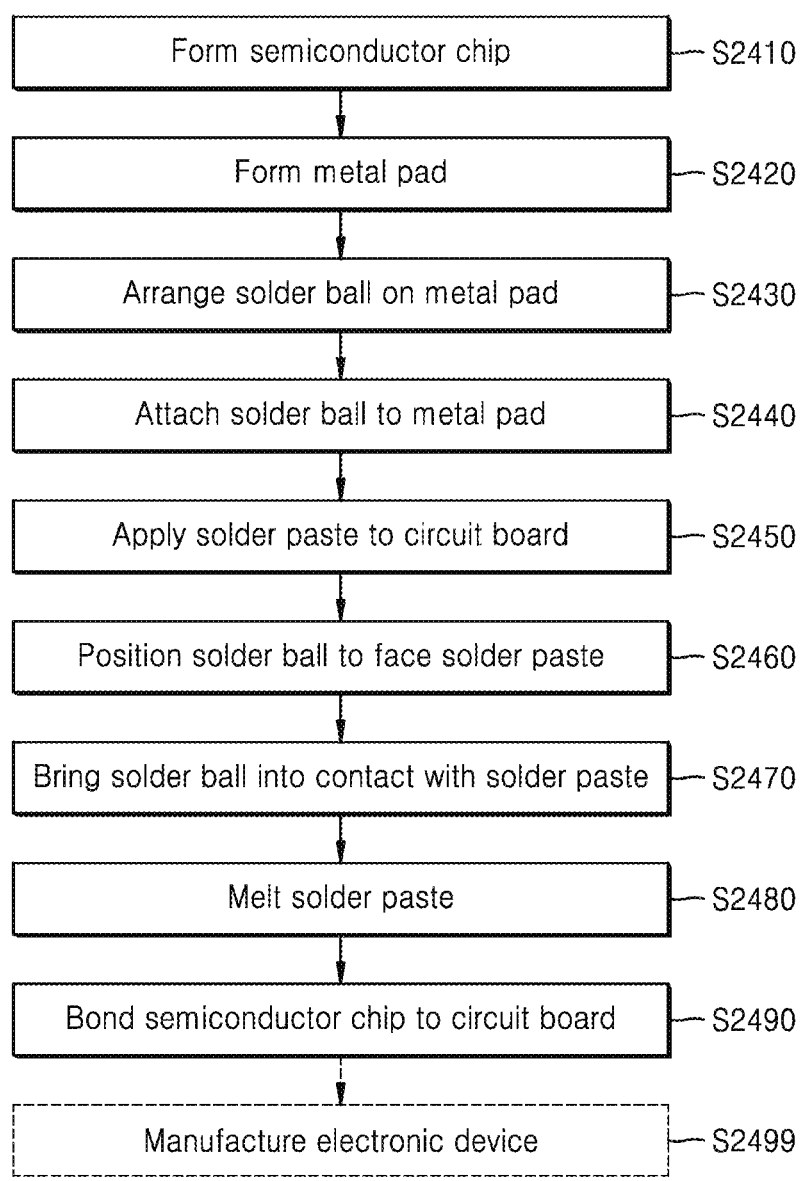
FIG. 24 is a flowchart illustrating a method of manufacturing a semiconductor device, according to some example embodiments.

Further, referring to FIG. 23 and FIG. 24, the solder paste 360 may be melted through a reflow process at S2480 to bond the solder ball 330 and the electrode 350 to thereby form the hybrid bonding structure 335 that bonds the semiconductor chip 310 to the circuit board 345 at S2490, thereby forming a semiconductor device according to some example embodiments. A melting point of a shell of a transient liquid phase of the solder paste 360 may be in a temperature range of, for example, about 120° C. to about 200° C. For example, the melting point of the shell of the transient liquid phase of the solder paste 360 may be in a temperature range of about 150° C. to about 190° C. In a reflow process, an intermetallic compound may be formed between the shell and a core of the transient liquid phase of the solder paste 360. For example, the core and the shell may form an intermetallic compound in a temperature range of about 20° C. to about 190° C. For example, the melting at S2480 may include melting the shell at about 20° C. to about 190° C. to form an intermetallic compound between the shell and the core.

A hybrid bonding structure may be cured during a cooling period in the reflow process.

According to a method of manufacturing a semiconductor device according to some example embodiments, a melting temperature may be lowered and mechanical properties of a solder joint may be improved by using a solder paste including a transient liquid phase having a core-shell structure.

The semiconductor device according to some example embodiments may include an active device or a passive device. The semiconductor device may be highly integrated on one substrate. At this time, a low-temperature bonding material is required to reduce defects and performance degradation due to thermal damage of the semiconductor device. Such a low-temperature bonding material may be applied to semiconductor devices according to some example embodiments. For example, the semiconductor device may include a memory semiconductor package or a module used in a data server, a mobile, or Laptop computer.

In some example embodiments, the semiconductor devices according to some example embodiments may be applied to a display device, including a flexible display, a wearable display, a foldable display, a stretchable display, and the like.

Figure 25:
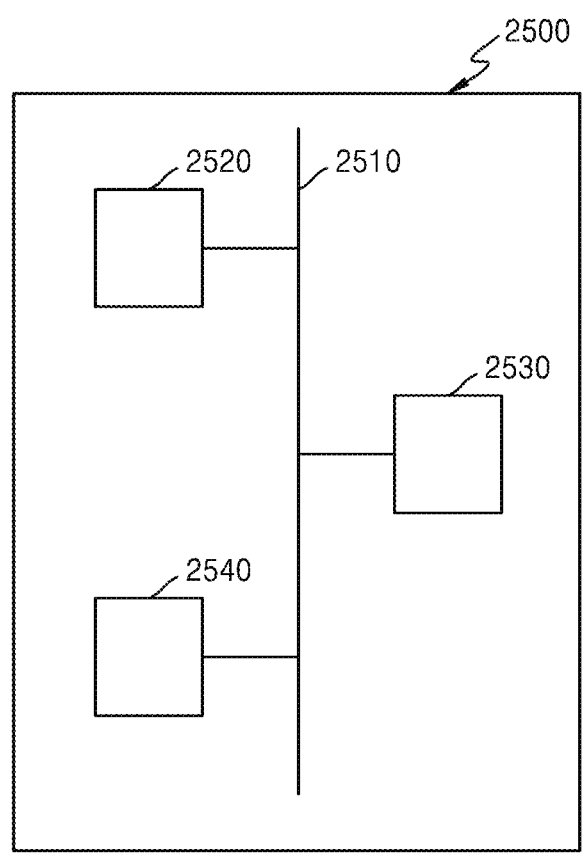
FIG. 25 is a schematic diagram of an electronic device according to some example embodiments.

FIG. 25 is a schematic diagram of an electronic device according to some example embodiments.

Referring to FIG. 25, the electronic device 2500 may include a processor 2520, a memory 2530, and a display device 2540 which are electrically connected to each other through a bus 2510. The processor 2520, the memory 2530, and/or the display device 2540 may include any one of the semiconductor devices according to any of the example embodiments herein. In some example embodiments the display device 2540 may be a flexible display, a wearable display, a foldable display, a stretchable display, and the like according to any of the example embodiments. The memory 2530, which is a non-transitory computer-readable medium, may store an instruction program. The processor 2520 may execute a stored instruction program to perform one or more functions. The processor 2520 may generate output (e.g., an image to be displayed on the display device 2540) based on such processing.

The memory 2530 may be a non-transitory computer readable medium and may store a program of instructions. The memory 2530 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 2520 may execute the stored program of instructions to perform one or more functions. The processor 2520 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 2520 may be configured to generate an output (e.g., an electrical signal) based on such processing.

Referring to FIG. 24 and FIG. 25, at S2499 an electronic device 2500 that includes the semiconductor device formed at S2490 may manufactured. For example, the semiconductor device may be incorporated (e.g., applied) into one or more elements of the electronic device 2500 to complete manufacturing of the electronic device 2500. Said one or more elements may include, for example, a display device 2540, a memory 2530, or a processor 2520. Said incorporation may include, as part of the manufacturing of the electronic device 2500, adhesion of the semiconductor device to one or more other components of the one or more elements via an adhesive, soldering of electrical connections between the semiconductor device and one or more other components of the one or more elements, or the like, in order to at least partially complete assembly of said one or more elements and/or assembly of said electronic device 2500.

Provided are hybrid bonding structures capable of bonding at a low temperature. By bonding a circuit board and a semiconductor chip at a low temperature by using a solder paste including a transient liquid phase, it is possible to reduce the deformation of a semiconductor package due to a high temperature. In addition, the hybrid bonding structure according to some example embodiments may reduce package defects of a semiconductor device by improving brittleness.

It should be understood that example embodiments described herein should be considered in a descriptive sense only and not for purposes of limitation. Descriptions of features or aspects within each example embodiment should typically be considered as available for other similar features or aspects in some example embodiments. While some example embodiments have been described with reference to the figures, it will be understood by those of ordinary skill in the art that various changes in form and details may be made therein without departing from the spirit and scope as defined by the following claims.

What is claimed is:

1. A hybrid bonding structure, comprising:
a solder ball; and
a solder paste bonded to the solder ball,
wherein the solder paste includes a mixture of a transient liquid phase and a flux,
wherein the transient liquid phase includes a core and a shell on a surface of the core,
wherein a melting point of the shell is lower than a melting point of the core,
wherein the core and the shell are configured to form an intermetallic compound in response to the transient liquid phase at least partially being at a temperature that is within a temperature range of about 20° C. to about 190° C.

2. The hybrid bonding structure of claim 1, wherein the core includes at least one of tin (Sn), silver (Ag), copper (Cu), indium (In), aluminum (Al), zinc (Zn), bismuth (Bi), nickel (Ni), or iron (Fe).

3. The hybrid bonding structure of claim 1, wherein the shell includes at least one of bismuth (Bi), indium (In), gallium (Ga), or silver (Ag).

4. The hybrid bonding structure of claim 1, wherein the solder ball includes a first tin (Sn)-silver (Ag)-copper (Cu) alloy.

5. The hybrid bonding structure of claim 4, wherein the core includes a second Sn—Ag—Cu alloy, and the shell includes bismuth (Bi).

6. The hybrid bonding structure of claim 1, wherein the core includes copper (Cu), and the shell includes at least one of indium (In) or silver (Ag).

7. The hybrid bonding structure of claim 1, wherein the melting point of the shell is in a temperature range of about 150° C. to about 200° C.

8. The hybrid bonding structure of claim 1, wherein a re-decomposition temperature of the intermetallic compound is in a temperature range of about 400° C. to about 650° C.

9. The hybrid bonding structure of claim 1, wherein a ratio of a thickness of the shell to a diameter of the core is in a range of about 0.02 to about 0.5.

10. The hybrid bonding structure of claim 1, wherein the solder paste further includes a metal particle, and the metal particle includes at least one of tin (Sn), indium (In), silver (Ag), gold (Au), copper (Cu), or nickel (Ni).

11. The hybrid bonding structure of claim 1, wherein the core of the transient liquid phase has a diameter in a range of about 20 μm to about 45 μm.

12. The hybrid bonding structure of claim 1, wherein a thickness of the shell of the transient liquid phase is in a range of about 1 μm to about 10 μm.

13. The hybrid bonding structure of claim 1, wherein the transient liquid phase further includes an insertion layer between the core and the shell.

14. The hybrid bonding structure of claim 13, wherein the insertion layer includes at least one of nickel (Ni), carbon nanotubes (CNT), graphene, or gallium (Ga).

15. The hybrid bonding structure of claim 1, wherein the solder ball includes at least one alloy of a Sn—Ag—Cu alloy, a Sn—Bi alloy, a Sn—Bi—Ag alloy, or a Sn—Ag—Cu—Ni alloy.

16. A semiconductor device, comprising:
a circuit board;
a semiconductor chip; and
a hybrid bonding structure between the circuit board and the semiconductor chip, the hybrid bonding structure including
a solder ball, and
a solder paste bonded to the solder ball,
wherein the solder paste includes a mixture of a transient liquid phase and a flux,
wherein the transient liquid phase includes a core and a shell on a surface of the core,
wherein a melting point of the shell is lower than a melting point of the core,
wherein the core and the shell are configured to form an intermetallic compound in response to the transient liquid phase at least partially being at a temperature that is within a temperature range of about 20° C. to about 190° C.

17. The semiconductor device of claim 16, wherein the core includes at least one of tin (Sn), silver (Ag), copper (Cu), indium (In), aluminum (Al), zinc (Zn), bismuth (Bi), nickel (Ni), or iron (Fe).

18. The semiconductor device of claim 16, wherein the shell includes at least one of bismuth (Bi), indium (In), gallium (Ga), or silver (Ag).

19. The semiconductor device of claim 16, wherein the solder ball includes a first tin (Sn)-silver (Ag)-copper (Cu) alloy.

20. The semiconductor device of claim 19, wherein the core includes a second Sn—Ag—Cu alloy, and the shell includes bismuth (Bi).

21. The semiconductor device of claim 16, wherein the core includes Cu, and the shell includes at least one of indium (In) or silver (Ag).

22. The semiconductor device of claim 16, wherein the melting point of the shell is in a temperature range of about 150° C. to about 200° C.

23. A method of manufacturing a semiconductor device, the method comprising:
forming a semiconductor chip;
arranging a solder ball on the semiconductor chip;
applying a solder paste to a circuit board, the solder paste including a flux and a transient liquid phase, the transient liquid phase including a core and a shell;
positioning the solder ball to face the solder paste;
melting the shell at about 20° C. to about 190° C. to form an intermetallic compound between the shell and the core; and
bonding the semiconductor chip to the circuit board.

24. The method of claim 23, wherein the core includes at least one of tin (Sn), silver (Ag), copper (Cu), indium (In), aluminum (Al), zinc (Zn), bismuth (Bi), nickel (Ni), or iron (Fe).

25. The method of claim 23, wherein the shell includes at least one of bismuth (Bi), indium (In), gallium (Ga), or silver (Ag).

26. The method of claim 23, further comprising:
manufacturing an electronic device that includes the semiconductor device.

27. An electronic device comprising the semiconductor device of claim 16.

28. A solder paste composition, comprising:
a mixture of a flux and a plurality of transient liquid phases,
wherein each transient liquid phase of the plurality of transient liquid phases includes
a core, and
a shell on a surface of the core,
wherein a melting point of the shell is lower than a melting point of the core, and
wherein the core and the shell of each transient liquid phase of the plurality of transient liquid phases are configured to form an intermetallic compound to bond the plurality of transient liquid phases to each other in response to the solder paste composition at least partially being at a temperature that is within a temperature range of about 20° C. to about 190° C.

29. The solder paste composition of claim 28, wherein the core includes at least one of tin (Sn), silver (Ag), copper (Cu), indium (In), aluminum (Al), zinc (Zn), bismuth (Bi), nickel (Ni), or iron (Fe).

30. The solder paste composition of claim 28, wherein the shell includes at least one of bismuth (Bi), indium (In), gallium (Ga), or silver (Ag).

31. The solder paste composition of claim 28, wherein the core includes a tin (Sn)-silver (Ag)-copper (Cu) alloy, and the shell includes bismuth (Bi).

32. The solder paste composition of claim 28, wherein the core includes copper (Cu), and the shell includes at least one of indium (In) or silver (Ag).

33. The solder paste composition of claim 28, wherein the melting point of the shell is in a temperature range of about 150° C. to about 200° C.

34. The solder paste composition of claim 28, wherein a re-decomposition temperature of the intermetallic compound is in a temperature range of about 400° C. to about 650° C.

35. The solder paste composition of claim 28, wherein a ratio of a thickness of the shell to a diameter of the core is in a range of about 0.02 to about 0.5.

36. The solder paste composition of claim 28, wherein the core has a diameter in a range of about 20 μm to about 45 μm.

37. The solder paste composition of claim 28, wherein a thickness of the shell is in a range of about 1 μm to about 10 μm.

38. The solder paste composition of claim 28, further comprising:
an insertion layer between the core and the shell.

39. The solder paste composition of claim 38, wherein the insertion layer includes at least one of nickel (Ni), carbon nanotubes (CNT), graphene, or gallium (Ga).

40. The solder paste composition of claim 28, wherein the shell completely covers the surface of the core.

41. A solder paste composition for bonding to a solder ball, the solder paste composition comprising:
a mixture of a transient liquid phase and a flux,
wherein the transient liquid phase includes
a core, and
a shell on a surface of the core,
wherein a melting point of the shell is lower than a melting point of the core, and
wherein the core and the shell are configured to form an intermetallic compound in response to the solder paste composition at least partially being at a temperature that is within a temperature range of about 20° C. to about 190° C.

\* \* \* \* \*